(12) United States Patent
Shinoda

(10) Patent No.: US 11,090,684 B2
(45) Date of Patent: Aug. 17, 2021

(54) PHOTOIRRADIATION DEVICE, PHOTOIRRADIATION METHOD

(71) Applicant: Ushio Denki Kabushiki Kaisha, Tokyo (JP)

(72) Inventor: Kazuhiko Shinoda, Tokyo (JP)

(73) Assignee: Ushio Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 16/620,146

(22) PCT Filed: Jun. 12, 2018

(86) PCT No.: PCT/JP2018/022349
§ 371 (c)(1),
(2) Date: Dec. 6, 2019

(87) PCT Pub. No.: WO2018/230546
PCT Pub. Date: Dec. 20, 2018

(65) Prior Publication Data
US 2020/0101491 A1    Apr. 2, 2020

(30) Foreign Application Priority Data

Jun. 12, 2017  (JP) .............................. JP2017-115470

(51) Int. Cl.
*B05D 3/06*       (2006.01)
*B29C 35/08*      (2006.01)
(Continued)

(52) U.S. Cl.
CPC .............. *B05D 3/067* (2013.01); *B29C 35/08* (2013.01); *B29C 35/0805* (2013.01);
(Continued)

(58) Field of Classification Search
CPC ......... B05D 3/067; C03C 25/104; F21V 7/09; B29C 2035/0827; H01B 13/003
See application file for complete search history.

(56) References Cited

U.S. PATENT DOCUMENTS

2019/0193113 A1* 6/2019 Johnson, III ........... H05B 45/44

FOREIGN PATENT DOCUMENTS

| JP | 59214010 A | * 12/1984 | ......... G02B 19/0023 |
| JP | S59-214010 A | 12/1984 | |

(Continued)

OTHER PUBLICATIONS

Notification of Transmittal of Copies of Translation of the International Preliminary Report on Patentability (Chapter I) and Translation of Written Opinion of the International Searching Authority; PCT/JP2018/022349; dated Dec. 26, 2019.
(Continued)

*Primary Examiner* — Robert J May
(74) *Attorney, Agent, or Firm* — Studebaker & Brackett PC (57) ABSTRACT

A photoirradiation device includes an insertion path for inserting a wire rod; a first reflector having a circular arc shape centered on a point shifted from a center of the insertion path by a first distance, one side of the first reflector facing the insertion path being a reflective surface; a second reflector disposed adjacent open edges of the first reflector and having a circular arc shape centered on a point shifted from the center of the insertion path by a second distance that is different from the first distance, one side of the second reflector facing the insertion path being a reflective surface; and a light source that is positioned on an opposite side of the insertion path from the first reflector and that projects light toward the wire rod.

17 Claims, 11 Drawing Sheets

(51) Int. Cl.
    *C03C 25/104* (2018.01)
    *F21V 7/09* (2006.01)
    *C03C 25/62* (2018.01)
    *C03C 25/622* (2018.01)
    *H01B 13/00* (2006.01)

(52) U.S. Cl.
    CPC ............ *C03C 25/104* (2013.01); *C03C 25/62* (2013.01); *C03C 25/622* (2013.01); *F21V 7/09* (2013.01); *H01B 13/0003* (2013.01); *H01B 13/003* (2013.01); *B29C 2035/0827* (2013.01)

(56) References Cited

FOREIGN PATENT DOCUMENTS

| | | | |
|---|---|---|---|
| JP | 2010-117531 | A | 5/2010 |
| JP | 2015-501271 | A | 1/2015 |
| JP | 2016-534967 | A | 11/2016 |
| WO | 2013/040582 | A2 | 3/2013 |
| WO | 2015/013309 | A1 | 1/2015 |

OTHER PUBLICATIONS

International Search Report issued in PCT/JP2018/022349; dated Aug. 14, 2018.
An Office Action; "Notice of Reasons for Refusal", mailed by the Japanese Patent Office dated Apr. 8, 2021, which corresponds to Japanese Patent Application No. 2017-115470 and is related to U.S. Appl. No. 16/620,146; with English language translation.

\* cited by examiner

PHOTOIRRADIATION DEVICE, PHOTOIRRADIATION METHOD

TECHNICAL FIELD

The present invention relates to a photoirradiation device that projects light toward wire rod, and a photoirradiation method.

BACKGROUND ART

Optical fiber is produced by coating the surface of bare optical fiber drawn from a preform, or optical fiber wound up on a bobbin, with resin. In this process, after coating the outer circumference of optical fiber (wire rod) with a UV-curable resin, a step of irradiating the resin with ultraviolet light is performed to cure the resin. More specifically, ultraviolet light is projected from a light source to the wire rod being moved at a predetermined speed.

Mercury lamps have been used conventionally as the light source. With the technological innovation of solid-state light source devices in recent years, application of LED devices in place of mercury lamps is being considered. However, the wire rod is generally very thin, with a diameter of about 0.1 mm to 1.0 mm, because of which it was difficult to efficiently project the light emitted from LED devices to the wire rod. Slowing down the speed of movement of the wire rod could be considered as one method of irradiating the wire rod with an amount of light necessary for the curing of the UV-curable resin. Such a method, however, is not preferable because it would lead to poorer production efficiency of optical fiber.

From these viewpoints, Patent Document 1 listed below discloses a configuration in which light sources are arranged such as to surround the wire rod for the purpose of efficiently irradiating the wire rod all around with light.

PRIOR ART DOCUMENT

Patent Document

Patent Document 1: JP-A-2010-117531

SUMMARY OF THE INVENTION

Problems to be Solved by the Invention

Patent Document 1 entails the problem that the device configuration is complex because of the need to arrange light sources such as to surround the wire rod. An object of the present invention is to provide a photoirradiation device that can project light toward a wire rod highly efficiently in a simple structure, and a photoirradiation method.

Means for Solving the Problems

A photoirradiation device according to the present invention includes:
an insertion path for inserting a wire rod;
a first reflector having a circular arc shape centered on a point shifted from a center of the insertion path by a first distance, one side of the first reflector facing the insertion path being a reflective surface;
a second reflector disposed adjacent open edges of the first reflector and having a circular arc shape centered on a point shifted from the center of the insertion path by a second distance that is different from the first distance, one side of the second reflector facing the insertion path being a reflective surface; and
a light source that is positioned on an opposite side of the insertion path from the first reflector and that projects light toward the wire rod.

Through vigorous research, the inventor of the present invention has verified that the amount of light projected to the wire rod is increased if a circular arc reflector centered on a point shifted from the center position of the insertion path (i.e., center position of the wire rod) is provided, as compared to when the center of the reflector is coincided with the center of the wire rod. Moreover, further intensive research by the inventor of the present invention has verified that the amount of light projected to the wire rod is further increased if the photoirradiation device includes a plurality of reflectors with varying decentering distances from the center of the wire rod as compared to when the device has a single reflector. The verified results will be described later in the section "Mode for carrying out the invention".

In the photoirradiation device described above, the light source can be configured by a plurality of LED devices.

In the photoirradiation device described above, the center of the insertion path can be shifted from a circular arc center of the first reflector and a circular arc center of the second reflector in a direction away from the light source.

The photoirradiation device may further include an insertion part made of a material having a transmitting property to light emitted from the light source, and forming the insertion path inside, wherein
the insertion part has an outer circumference positioned closer to the circular arc center of the first reflector relative to the reflective surface of the first reflector, and positioned closer to the circular arc center of the second reflector relative to the reflective surface of the second reflector.

In the photoirradiation device described above, the reflective surface of the first reflector and the reflective surface of the second reflector may be formed as a curved surface, or formed by a plurality of flat surfaces arranged in a circular arc shape. Also, one of the reflective surface of the first reflector and the reflective surface of the second reflector may be formed as a curved surface, while the other reflective surface may be formed by a plurality of flat surfaces arranged in a circular arc shape.

The present invention also provides a photoirradiation method with which a photoirradiation device projects light toward a wire rod,
the photoirradiation device including:
a first reflector having a circular arc shape and an inwardly facing surface as a reflective surface;
a second reflector disposed adjacent open edges of the first reflector and having a circular arc shape and an inwardly facing surface as a reflective surface; and
a light source that projects light toward the wire rod,
the photoirradiation method including:
a step of inserting the wire rod into a region inside the reflective surface of the first reflector and inside the reflective surface of the second reflector such that a center position of the wire rod is shifted by a first distance from a center of the reflective surface of the first reflector and shifted by a second distance that is different from the first distance from a center of the reflective surface of the second reflector; and
a step of projecting light toward the wire rod from the light source positioned on an opposite side of the wire rod from the first reflector.

Effect of the Invention

With the photoirradiation device of the present invention, wire rod can be irradiated with light highly efficiently in a simple structure.

MODE FOR CARRYING OUT THE INVENTION

Embodiments of the photoirradiation device according to the present invention will be described with reference to the drawings. The dimensional ratios of the drawings in various figures described below are not necessarily the same as the actual dimensional ratios.

[Structure]

Figure 1:
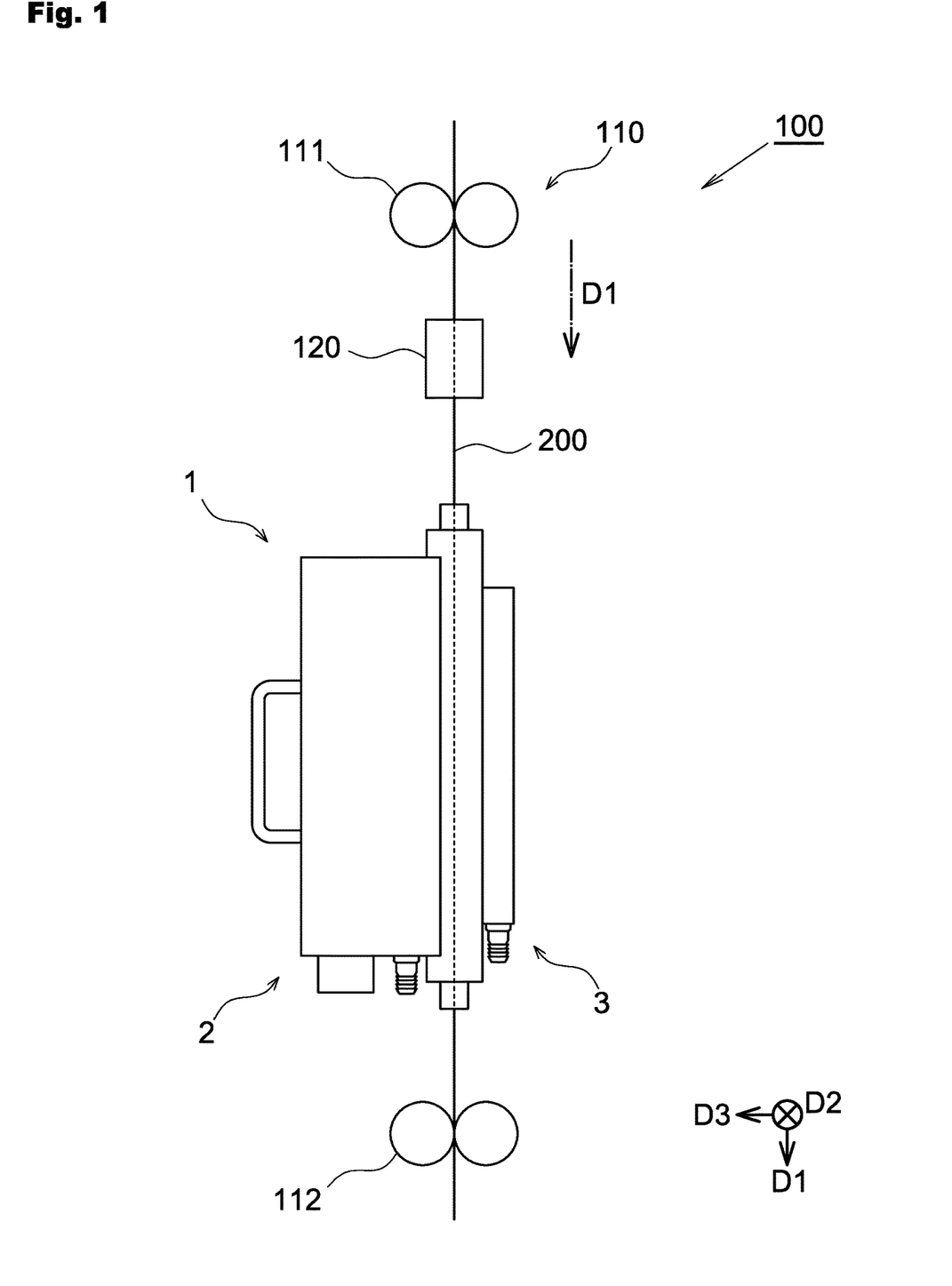
FIG. 1 is a drawing that schematically shows a structure of an optical fiber production apparatus that includes a photoirradiation device.

FIG. 1 is a schematic drawing of a structure of an optical fiber production apparatus that includes a photoirradiation device. As shown in FIG. 1, the photoirradiation device 1 is used as part of the optical fiber production apparatus 100 that produces optical fiber. Below, the optical fiber production apparatus 100 will be described prior to the description of the photoirradiation device 1.

The optical fiber production apparatus 100 includes a transfer device 110 that transfers optical fiber 200, and a coating device 120 that coats the optical fiber 200 with UV-curable resin as the optical fiber is transferred. The optical fiber 200 is a bare optical fiber that is glass fiber, for example, and as the bare optical fiber passes through the coating device 120, the UV-curable resin is coated on the outer circumference of the bare optical fiber. The transfer device 110 includes transfer members 111 and 112 upstream and downstream respectively of the photoirradiation device 1 for holding and transferring the optical fiber 200 in direction D1 in FIG. 1 so that the optical fiber 200 is inserted to a predetermined position inside the photoirradiation device 1. The optical fiber 200 corresponds to the "wire rod".

Three axes D1, D2, and D3 orthogonal to each other are defined in FIG. 1. Hereinafter, the reference numerals D1, D2, and D3 may be used when referring to a direction.

The photoirradiation device 1 irradiates the optical fiber 200, which is transferred in direction D1 at a speed of 1000 m/min, for example, with ultraviolet light. This causes the resin coated on the outer circumference of the optical fiber 200 to cure. The optical fiber 200 that has passed through the photoirradiation device 1 thus comes out with a configuration wherein the outer circumference of the bare optical fiber is covered by a coating film of the cured UV-curable resin.

Figure 2:
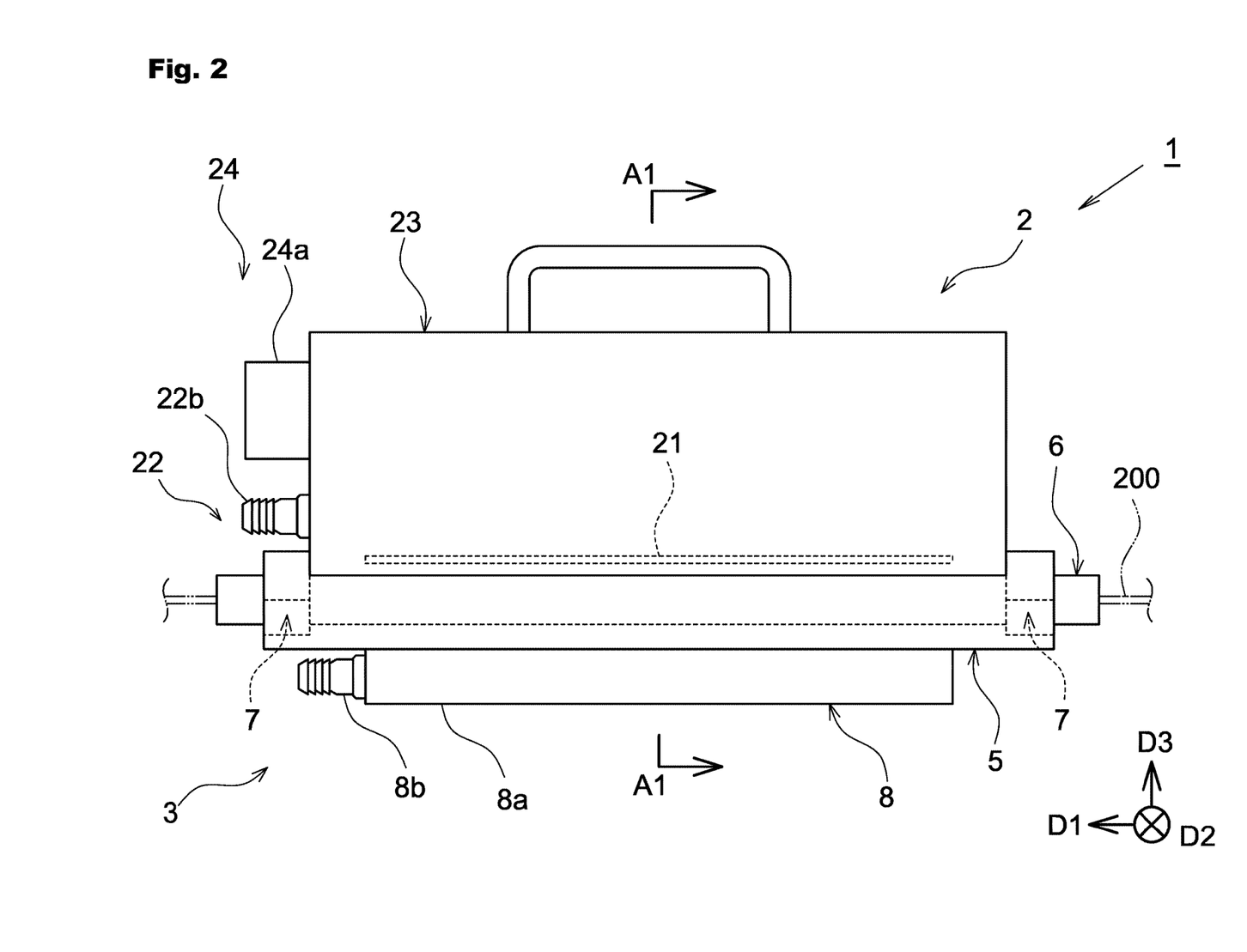
FIG. 2 is an overall front view that schematically shows a structure of the photoirradiation device.
Figure 3:
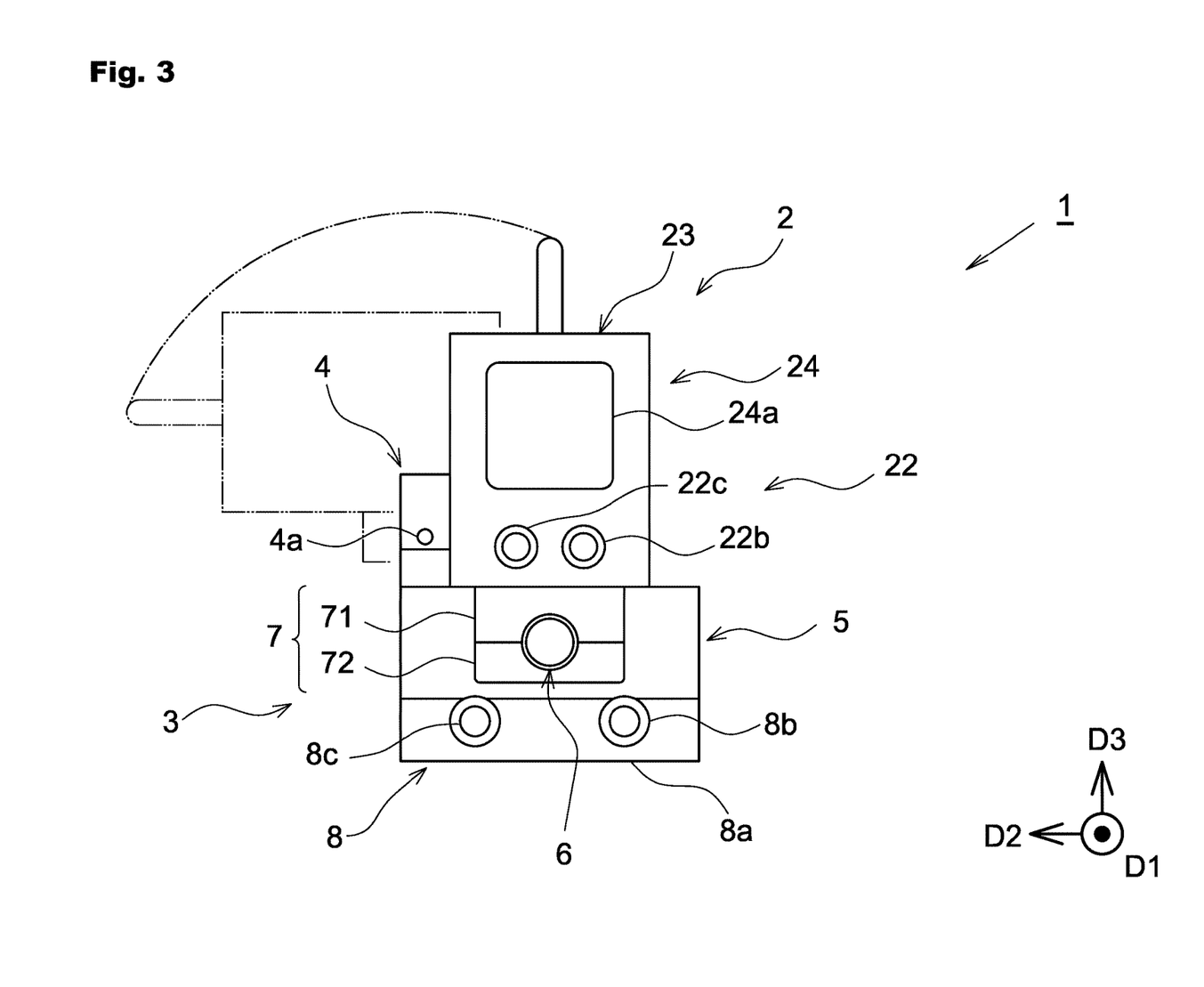
FIG. 3 is an overall side view that schematically shows the structure of the photoirradiation device.
Figure 4:
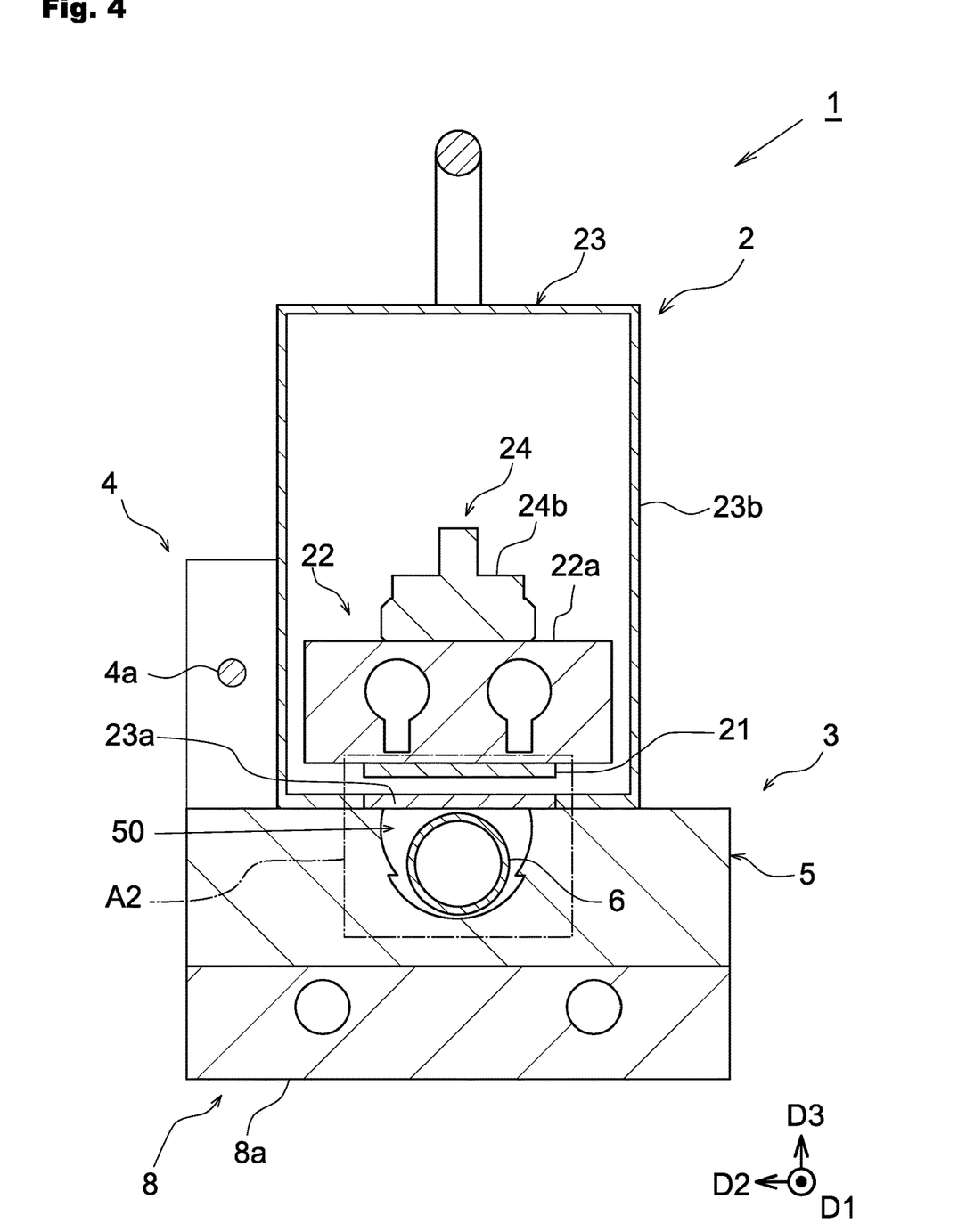
FIG. 4 is a cross-sectional view along A1-A1 in FIG. 2.
Figure 5:
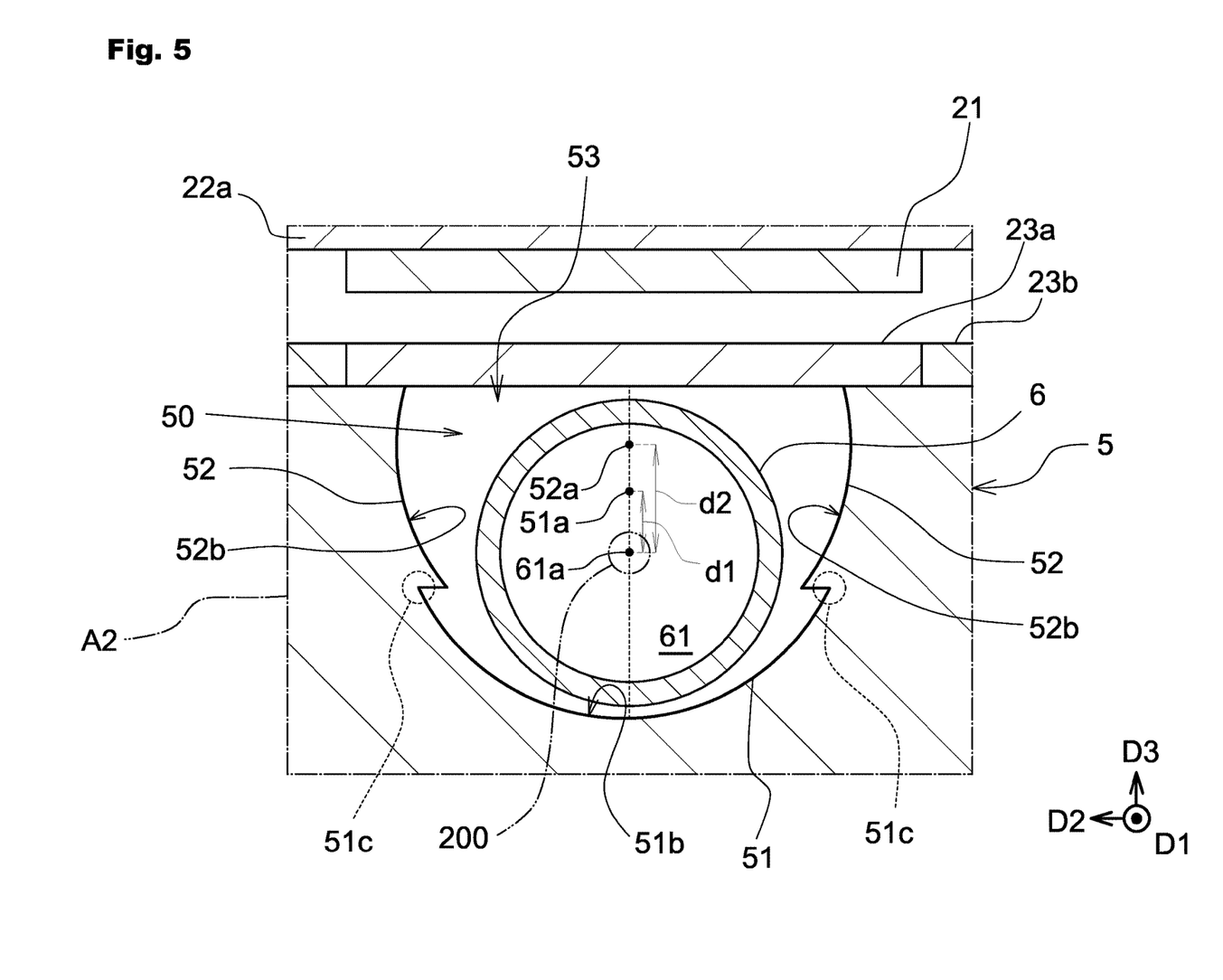
FIG. 5 is an enlarged view of region A2 in FIG. 4.

Next, the structure of the photoirradiation device 1 will be described with reference to FIG. 2 to FIG. 5. FIG. 2 is an overall front view that schematically shows the structure of the photoirradiation device 1. FIG. 3 is an overall side view that schematically shows the structure of the photoirradiation device 1. FIG. 4 is a cross-sectional view along A1-A1 in FIG. 2. FIG. 5 is an enlarged view of region A2 in FIG. 4.

As shown in FIG. 2 to FIG. 4, the photoirradiation device 1 includes a light source unit 2 that projects light toward the optical fiber 200, and an insertion unit 3 into which the optical fiber 200 is inserted. The photoirradiation device 1 includes a connecting part 4 that connects the light source unit 2 to the insertion unit 3 such as to be rotatable around a rotation axis 4a.

The light source unit 2 includes a light source 21 that projects light toward the optical fiber 200, a light source cooling part 22 that cools the light source 21, and a housing 23 that accommodates the light source 21 and others. The light source unit 2 includes a power supply unit 24 for supplying power to the light source 21.

The light source 21 is elongated along the transfer direction D1 of the optical fiber 200 and positioned to face the optical fiber 200. In this embodiment, the light source 21 is configured by a substrate on which a plurality of LED devices are mounted. As an example, the light source 21 radiates a UV ray (e.g., of 300 nm to 400 nm wavelength) to cure the UV-curable resin.

The light source cooling part 22 is coupled to the light source 21 and includes a cooler main body 22a in which a coolant (e.g., cooling water) flows, an inlet 22b for introducing the coolant into the cooler main body 22a, and an outlet 22c for discharging the coolant from the cooler main body 22a. The cooler main body 22a is positioned inside the housing 23, while the inlet 22b and the outlet 22c are located outside the housing 23.

The housing 23 includes a light-transmitting part 23a that lets light emitted from the light source 21 pass through, and a light-shielding part 23b that blocks the light. The light-transmitting part 23a is elongated along the transfer direction D1 of the optical fiber 200 and positioned to face the light source 21. Namely, the light-transmitting part 23a is located between the light source 21 and the optical fiber 200.

The power supply unit 24 includes a power source connector 24a to which a cable and the like is connected, and a terminal block 24b that has various terminals for electrically connecting the power source connector 24a and the light source 21, so as to supply power from the outside. The power source connector 24a is located outside the housing 23, while the terminal block 24b is disposed inside the housing 23.

Fixing parts 7 include a pair of clamp members (71, 72) for clamping an insertion part 6. The pairs of the clamp members (71, 72) of the fixing parts 7 clamp end parts in the longitudinal direction (direction D1) of the insertion part 6, and thus the end parts in the longitudinal direction of the insertion part 6 and end parts in the longitudinal direction of a main body 5 are fixed together.

The insertion unit 3 includes the main body 5 in which the optical fiber 200 is inserted, the insertion part 6 in which an insertion path 61 is formed (see FIG. 5) for inserting the optical fiber 200 into the main body 5, and the fixing parts 7 that secure the insertion part 6 to the main body 5. The insertion unit 3 includes a main body cooling part 8 that cools the main body 5.

The main body cooling part 8 is coupled to the main body 5 and includes a cooler main body 8a in which a coolant (e.g., cooling water) flows, an inlet 8b for introducing the cooling water into the cooler main body 8a, and an outlet 8c for discharging the cooling water from the cooler main body 8a. The main body cooling part 8 (cooler main body 8a) is configured to be detachably attached to the main body 5.

As shown in FIG. 4 and FIG. 5, the main body 5 is elongated along the transfer direction D1 of the optical fiber 200 and includes a hollow part 50 along the longitudinal direction, in which the optical fiber 200 is inserted. As shown in FIG. 5, the inner surface of the hollow part 50 includes a first reflector 51 having a reflective surface 51b and a second reflector 52 having a reflective surface 52b. The second reflector 52 is disposed adjacent the open edges 51c of the first reflector 51. The hollow part 50 has an opening 53 on one side in the circumferential direction of the first reflector 51.

The first reflector 51 and the second reflector 52 are elongated along the transfer direction D1 of the optical fiber 200. The reflective surface 51b of the first reflector 51 and the reflective surface 52b of the second reflector 52 are formed as a curved surface. More specifically, both reflective surfaces (51b, 52b) are a circular arc that is a part of an exact circle in a cross section in a plane orthogonal to the longitudinal direction (D2-D3 plane).

The region where the reflective surface 51b of the first reflector 51 connects to the reflective surface 52b of the second reflector 52 may be formed as a reflective surface, or may be formed as a non-reflective surface.

The opening 53 is elongated along the transfer direction D1 of the optical fiber 200. The opening 53 is covered by the light-transmitting part 23a and positioned to face the light source 21.

The insertion part 6 is formed by a tubular member having the insertion path 61 inside, and made of a material having a transmitting property to light emitted from the light source 21. As shown in FIG. 5, the insertion path 61 is circular when viewed from the transfer direction D1 of the optical fiber 200, i.e., in the D2-D3 plane. The light emitted from the light source 21 propagates through the light-transmitting part 23a, opening 53, and insertion part 6, and irradiates the outer circumferential surface of the optical fiber 200 passed through the insertion path 61. Part of light is reflected once or multiple times by the reflective surface 51b of the first reflector 51 or the reflective surface 52b of the second reflector 52 and irradiates the outer circumferential surface of the optical fiber 200 passed through the insertion path 61.

The insertion part 6 is a quartz tube, for example, which is filled with nitrogen. Some substances volatilize from the resin on the outer surface of the optical fiber 200 as it cures, and this configuration prevents such volatilized substances from adhering on the light source unit 2 (light-transmitting part 23a) and the reflective surfaces (51b, 52b).

As shown in FIG. 5, the first reflector 51 is arranged such that the center 51a of the circular arc reflective surface 51b is shifted by a first distance d1 from the center 61a of the insertion path 61. The second reflector 52 is arranged such that the center 52a of the circular arc reflective surface 52b is shifted by a second distance d2 from the center 61a of the insertion path 61. The second distance d2 is different from the first distance d1. In this embodiment described herein, the center 52a of the reflective surface 52b of the second reflector 52 is shifted from the center 61a of the insertion path 61 more than the center 51a of the reflective surface 51b of the first reflector 51, i.e., d2>d1.

It will be described later why the irradiation efficiency for the optical fiber 200 is improved by this configuration wherein both the center 51a of the reflective surface 51b of the first reflector 51 and the center 52a of the reflective surface 52b of the second reflector 52 are shifted from the center 61a of the insertion path 61 and the decentering distances are different from each other.

[Effects]

Through vigorous research, the inventor of the present invention established that decentering the optical fiber 200 from the centers of the circular arc reflective surfaces of the reflectors improved the irradiation efficiency for the optical fiber 200. Further extensive research led the inventor of the present invention to confirm that the irradiation efficiency for the optical fiber 200 is increased even more by a multiple reflector configuration, with the respective reflective surfaces of the reflectors being decentered from the optical fiber 200, as mentioned in the embodiment described above.

First, how the efficiency of irradiation of the optical fiber 200) is improved by decentering the optical fiber 200 from the centers of the circular arc reflective surfaces of the reflectors will be described below.

Figure 6:
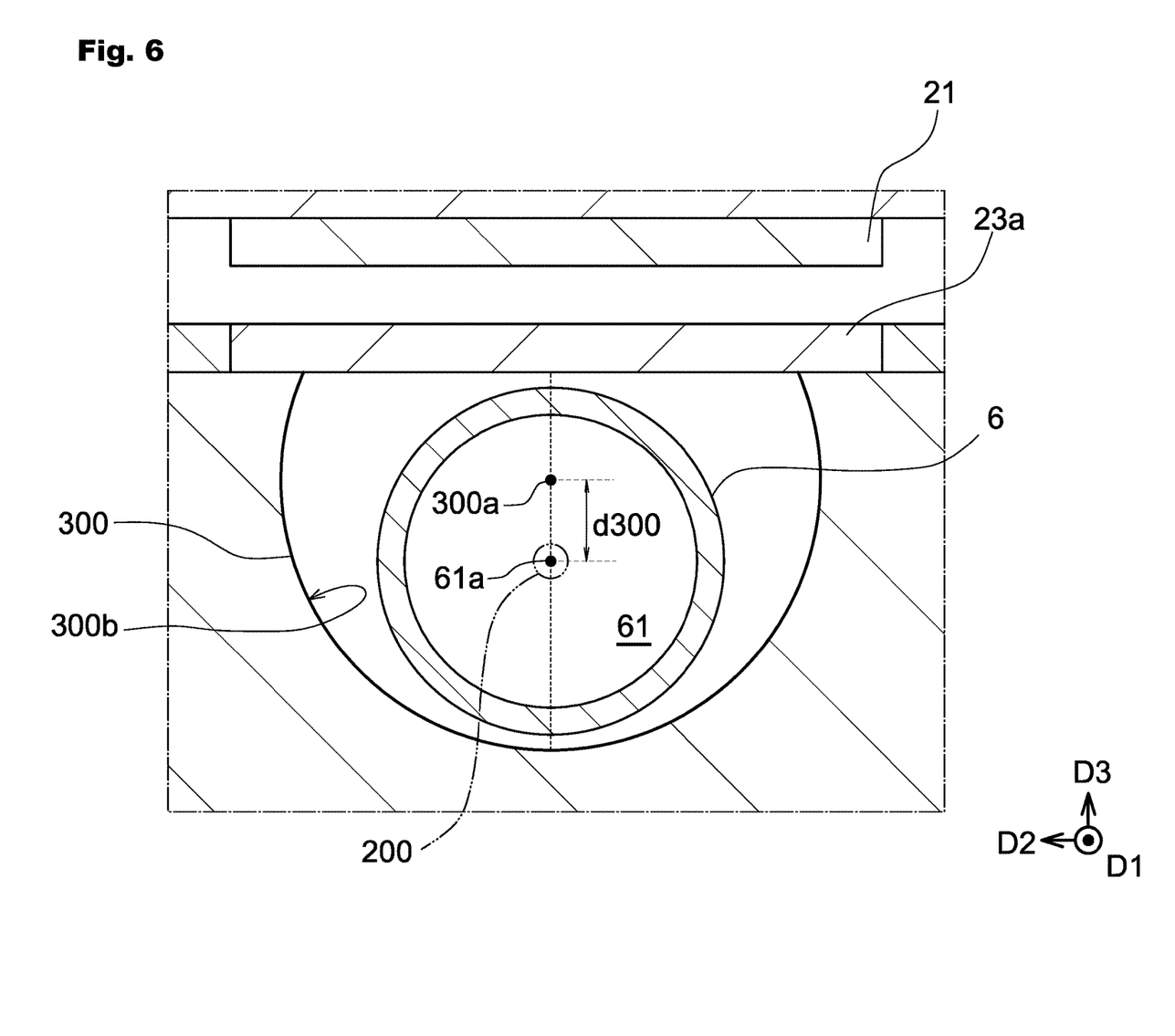
FIG. 6 is a drawing that shows a photoirradiation device that is a reference example in a way corresponding to FIG. 5.

FIG. 6 shows the structure of a photoirradiation device that is a reference example in a way similar to FIG. 5. This photoirradiation device has a single reflector 300 unlike the present embodiment. The reflective surface 300b of this reflector 300 is formed in a circular arc shape and the center 300a is shifted from the center 61a of the insertion path 61 by distance d300.

Figure 7A:
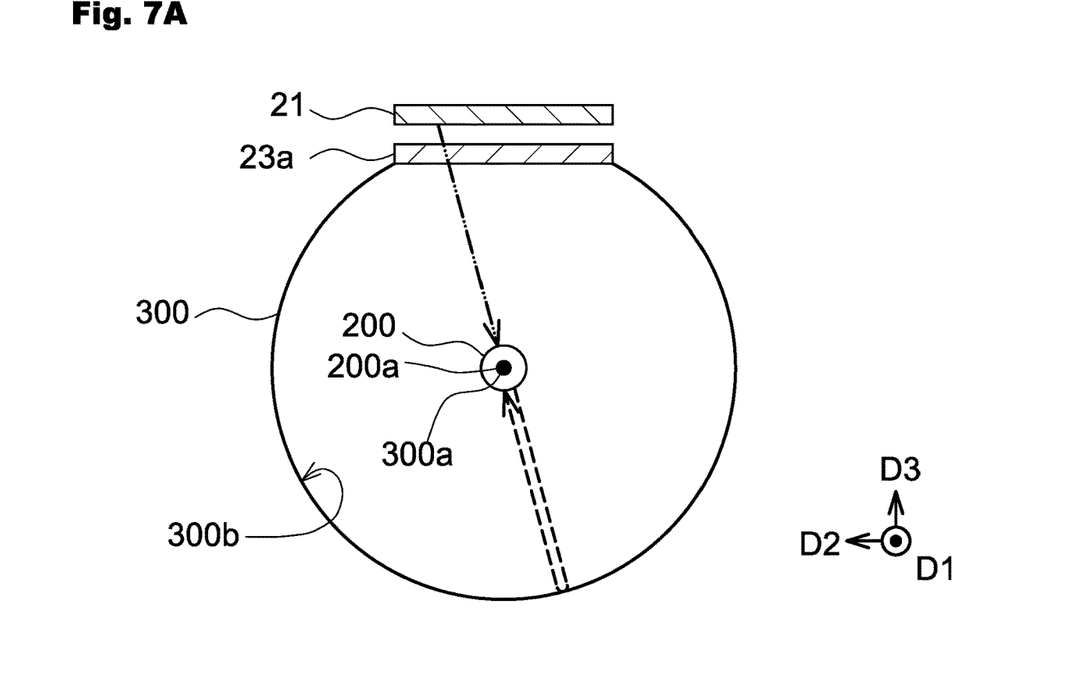
FIG. 7A is a diagram explaining how light is projected to the optical fiber in a photoirradiation device of a comparative example.
Figure 7B:
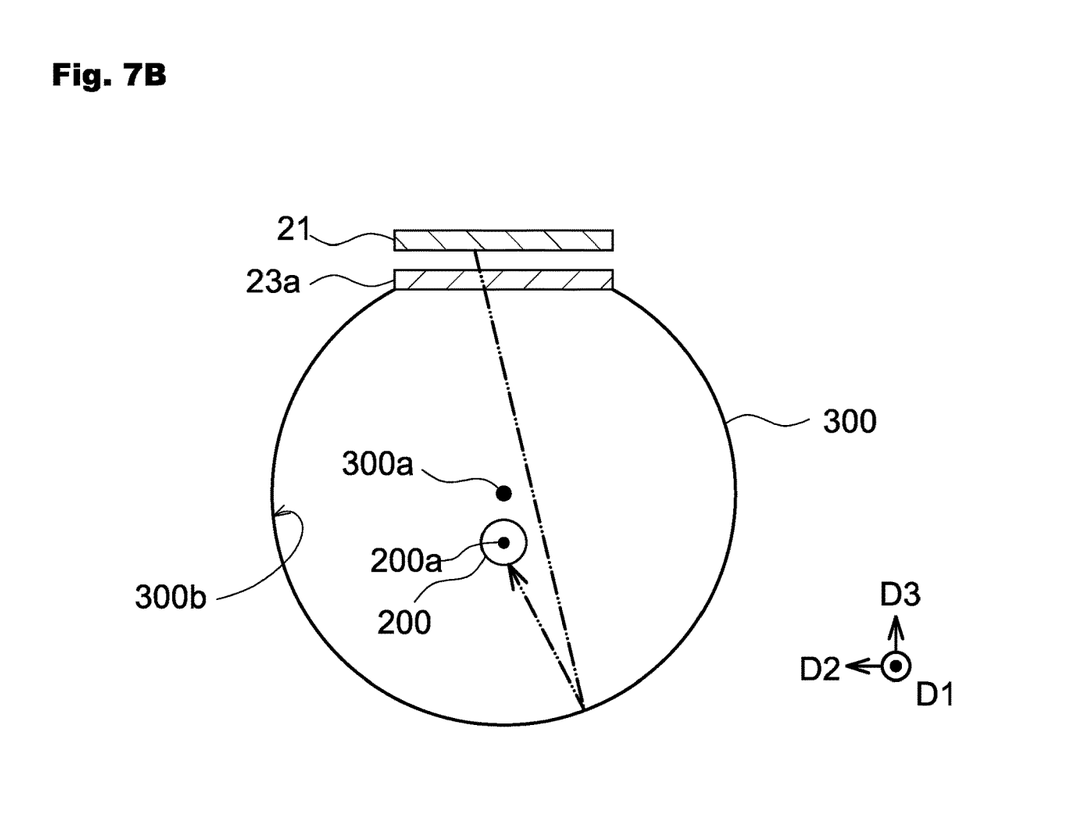
FIG. 7B is a diagram explaining how light is projected to the optical fiber in the photoirradiation device of the reference example.

FIG. 7A is a diagram explaining how light is projected to the optical fiber 200 in a photoirradiation device of a comparative example. FIG. 7B is a diagram explaining how light is projected to the optical fiber 200 in the photoirradiation device of the reference example. Unlike the reference example, the comparative example has the center 300a of the circular arc reflective surface 300b of the reflector 300 coinciding with the center 200a of the optical fiber 200.

In FIG. 7A, the center 200a of the optical fiber 200 coincides with the center 300a of the circular arc reflective surface 300b of the reflector 300. In this case, to irradiate the backside of the optical fiber 200 (opposite side from the side facing the light source 21), the light has to be reflected by the reflective surface 300b after passing through the area around the center 300a of the reflective surface 300b (see the broken line in FIG. 7A).

However, such light passing through the area around the center 300a of the reflective surface 300b irradiates the front side (facing the light source 21) of the optical fiber 200 (see the two-dot chain line in FIG. 7A). The backside of the optical fiber 200 is therefore irradiated with light less than the front side of the optical fiber 200.

With the circular arc reflective surface 300b, lateral sides (left side and right side in FIG. 7A) of the optical fiber 200 positioned at the center 300a of the circular arc reflective surface 300b are hardly irradiated with light. This is because, in geometrical optics, the light rays travelling toward the center 300a of the circular arc reflective surface 300b consist only of direct rays propagating from the light source 21 located on one circumferential side of the optical fiber 200, and reflected rays that are the light perpendicularly incident to the reflective surface, i.e., the ranges of the direct rays toward the center 300a and the reflected rays are limited to the front side and the backside. Lateral sides of the optical fiber 200 are therefore hardly irradiated with light.

In contrast, in the reference example of FIG. 7B, the center 200a of the optical fiber 200 is shifted from the center 300a of the circular arc reflective surface 300b of the reflector 300. In this case, the light does not need to pass through the area around the optical fiber 200 in order to irradiate the backside of the optical fiber 200. The backside of the optical fiber 200) is therefore irradiated with light as much as the front side of the optical fiber 200. Moreover, lateral sides of the optical fiber 200 are also favorably irradiated with light.

As compared to the comparative example of FIG. 7A, light emitted from the light source 21 can be projected to the outer circumference of the optical fiber 200 with higher efficiency in the reference example of FIG. 7B.

Next, how the irradiation efficiency is increased even more than the reference example by the two-tiered reflector configuration (first reflector 51 and second reflector 52) of the photoirradiation device 1, as in this embodiment, will be described.

Figure 8:
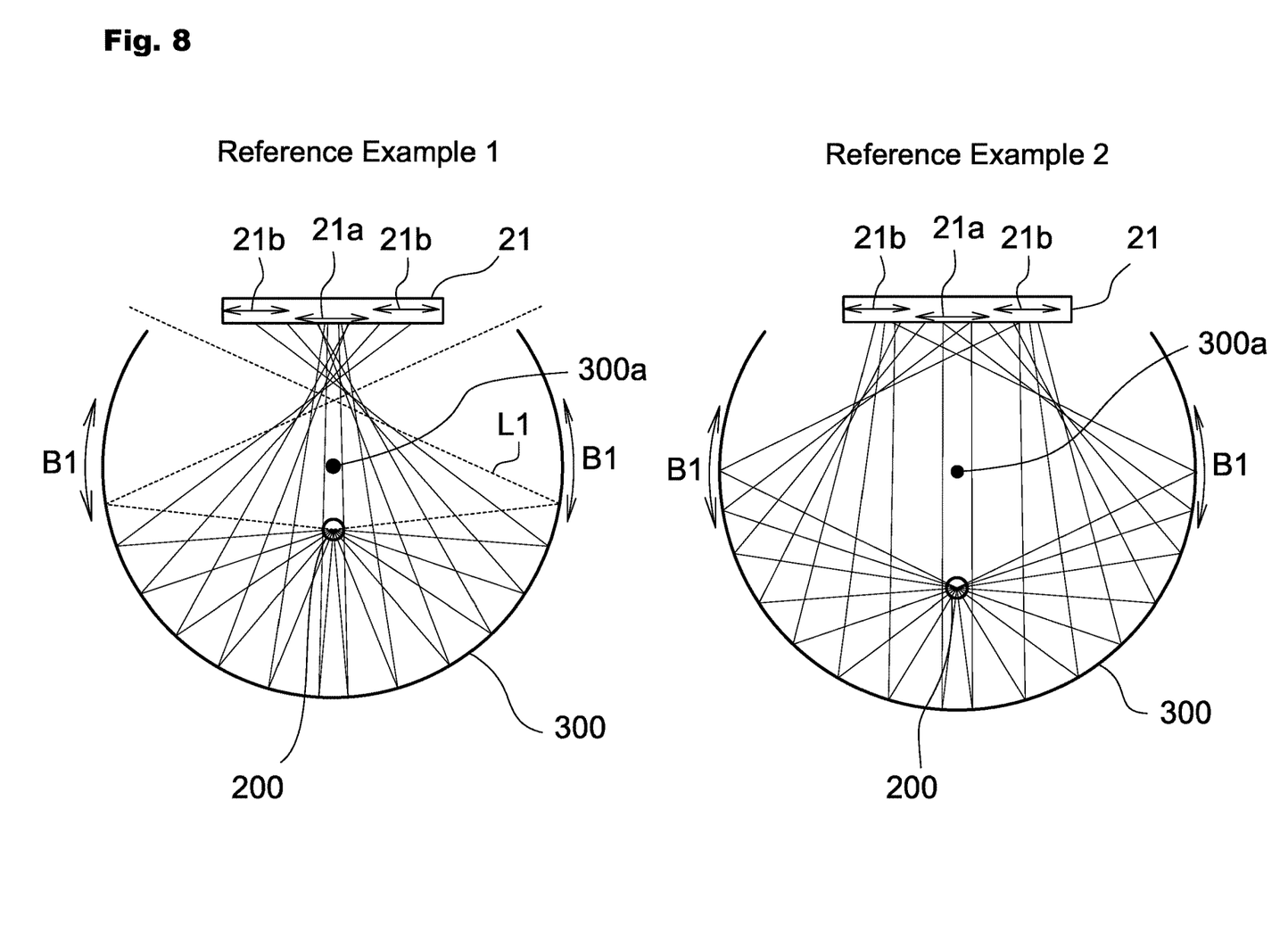
FIG. 8 is a drawing that schematically shows reverse ray traces of photoirradiation devices of reference examples.

FIG. 8 is a drawing that schematically shows reverse ray traces of photoirradiation devices of reference examples having the reflector 300. This drawing schematically shows trace results of the rays emitted from an imaginary point light source positioned at the center 200a of the optical fiber 200, i.e., reversely from the photoirradiation device 1. Tracing the rays in this drawing reversely allows for determination of light beams that can be projected to the center 200a of the optical fiber 200. FIG. 8 shows only the light that reaches the light source 21 after emitted from the imaginary point light source and reflected by the reflector 300. In FIG. 8, Reference Example 2 is a counterpart of Reference example 1, wherein the center 300a of the reflector 300 is shifted from the center of the optical fiber 200 even more.

The drawing of Reference Example 1 shows that some of the rays emitted from the point light source positioned at the center of the optical fiber 200, i.e., the rays L1 incident in regions B1 of the reflector 300 located in the lateral direction relative to the light source 21 propagate outwardly away from the light source 21. This means that the light emitted from the light source 21 and incident in the regions B1 of the reflector 300 will not propagate toward the optical fiber 200.

When the light source 21 is configured by an LED device, the light emitted from the light source 21 diverges at a wider angle so that the light also enters the regions B1 of the reflector 300. However, this light does not propagate to the optical fiber 200 as described above, but instead, returns to the light source 21 after being reflected once or multiple times by the reflective surface of the reflector 300. Namely, it can be seen that this light cannot be effectively utilized as the light projected to the optical fiber 200.

In contrast, the drawing of Reference Example 2 wherein the amount of displacement is increased shows that some of the rays emitted from the point light source positioned at the center of the optical fiber 200, i.e., the rays incident in regions B1 of the reflector 300 in the drawing of Reference Example 1, also propagate toward the light source 21.

Reference Example 1 in FIG. 8 shows that light emitted from a central region 21a of the light source 21 at a relatively small divergence angle propagates to the optical fiber 200 after being reflected by the reflector 300 at a higher rate. In Reference Example 2, in contrast, it can be ascertained that light emitted from the central region 21a of the light source 21 at a relatively small divergence angle hardly propagates to the optical fiber 200. On the other hand, in Reference Example 2, the ratio of light emitted from the light source 21 and propagating toward the optical fiber 200 to the light incident in the regions B1 of the reflector 300 is higher than that of Reference Example 1.

The following conclusion can be derived from the analysis results. In the configuration of Reference Example 1, the light emitted from the light source 21 and incident in the regions B1 of the reflector 300 is not effectively utilized for the irradiation of the optical fiber 200. With respect to the configuration of Reference Example 2, the light emitted from the light source 21 and incident in the regions B1 of the reflector 300 can be utilized more effectively to irradiate the optical fiber 200 than Reference Example 1. On the other hand, the light emitted from the central region 21a of the light source 21 at a relatively small divergence angle is not utilized for the irradiation of the optical fiber 200 as much as Reference Example 1.

Further, it can be seen from FIG. 8 that the divergence angles of the light emitted from end regions 21b of the light source 21 at which the light can reach the optical fiber 200 are different between Reference Example 1 and Reference Example 2. This means that, even if a light ray propagating at a divergence angle $\theta_1$ from an end region 21b of the light source 21 in the configuration of Reference Example 1 reaches the optical fiber 200 after being reflected by the reflector 300, it is possible that a light ray propagating at the same divergence angle $\theta_1$ from an end region 21b of the light source 21 in the configuration of Reference Example 2 may not reach the optical fiber 200 after being reflected by the reflector 300. The same applies vice versa.

Figure 9:
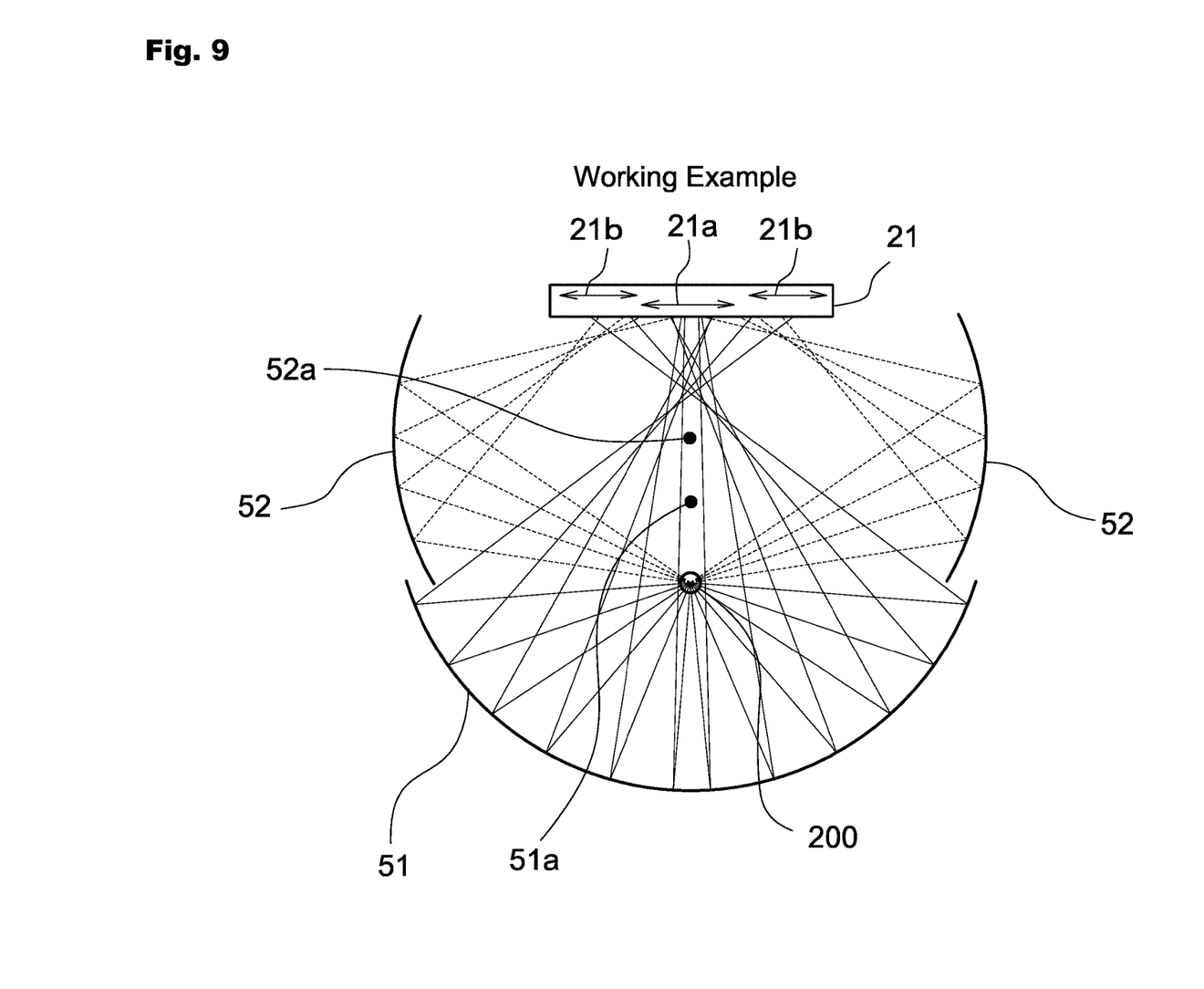
FIG. 9 is a drawing that schematically shows a reverse ray trace of the photoirradiation device according to a working example.

FIG. 9 is a drawing that schematically shows a reverse ray trace of the photoirradiation device 1 of this embodiment (Working Example), and shows only the light reflected by the reflectors (51, 52) similarly to FIG. 8. As mentioned above, the photoirradiation device 1 of this embodiment includes two reflectors (51, 52) with different amounts of displacement relative to the center of the optical fiber 200. Consequently, the first reflector 51 with a smaller amount of displacement relative to the center of the optical fiber 200 directs the light emitted at a relatively small divergence angle from a central region 21a of the light source 21 highly efficiently to the optical fiber 200, while the second reflector 52 with a larger amount of displacement relative to the center of the optical fiber 200 directs the light emitted from end regions 21b of the light source 21 as well as the light emitted at a relatively large divergence angle from a central region 21a of the light source 21 highly efficiently to the optical fiber 200.

Namely, the photoirradiation device 1 of this embodiment can direct some of the light rays emitted from the light source 21, i.e., the light that the reflector 300 of Reference Example 1 would guide to the optical fiber 200, as well as the light that the reflector 300 of Reference Example 2 would guide to the optical fiber 200, toward the optical fiber 200 at a high rate by means of two different reflectors (51, 52). It is assumed that this was why the photoirradiation device 1 of this embodiment was capable of directing light to the optical fiber 200 more efficiently than the photoirradiation devices of the reference examples. Results of an actual simulation confirmed that the optical fiber 200 was irradiated with more light in the Working Example as compared to Reference Example 1 and Reference Example 2.

Figure 10:
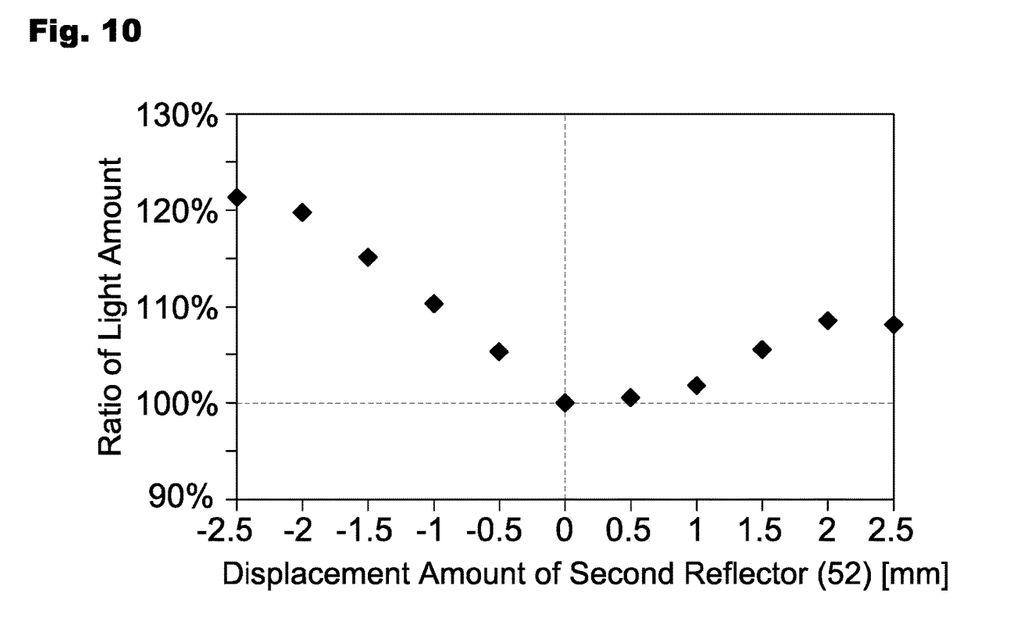
FIG. 10 is a graph showing the relationship between amount of displacement of the second reflector and amount of light projected to the optical fiber.

FIG. 10 is a graph showing changes in the amount of light projected to the optical fiber 200 in the photoirradiation device 1 of this embodiment when the position of the center 52a of the reflective surface 52b of the second reflector 52 is varied while the positions of the center of the optical fiber 200 and the center 51a of the reflective surface 51b of the first reflector 51 are fixed. In FIG. 10, the horizontal axis represents the amount of displacement of the center 52a of the reflective surface 52b of the second reflector 52 relative to the center 51a of the reflective surface 51b of the first reflector 51. In FIG. 10, the vertical axis represents the relative value (ratio) of the amount of projected light relative to the projected light when the center 52a of the reflective surface 52b of the second reflector 52 is coincided with the center 51a of the reflective surface 51b of the first reflector 51.

In FIG. 10, negative values (−) of the amount of displacement mean that the center is shifted toward the light source 21, whereas positive values (+) of the amount of displacement mean that the center is shifted away from the light source 21. The amount of displacement being zero indicates that the center 52a of the reflective surface 52b of the second reflector 52 is coincided with the center 51a of the reflective surface 51b of the first reflector 51, which corresponds to the photoirradiation devices of the reference examples (Reference Example 1 and Reference Example 2).

FIG. 10 confirmed that the amount of light projected to the optical fiber 200 was increased as compared to the photoirradiation devices of the reference examples in the region where the amount of displacement of the center 52a of the second reflector 52 was negative. This result conforms to the analysis content described in the foregoing. On the other hand, according to the result in FIG. 10, it is also confirmed that the amount of light projected to the optical fiber 200 was increased as compared to the photoirradiation devices of the reference examples also in the region where the amount of displacement of the center 52a of the second reflector 52 was positive. The inventor of the present invention assumes the reason as follows.

Figure 11:
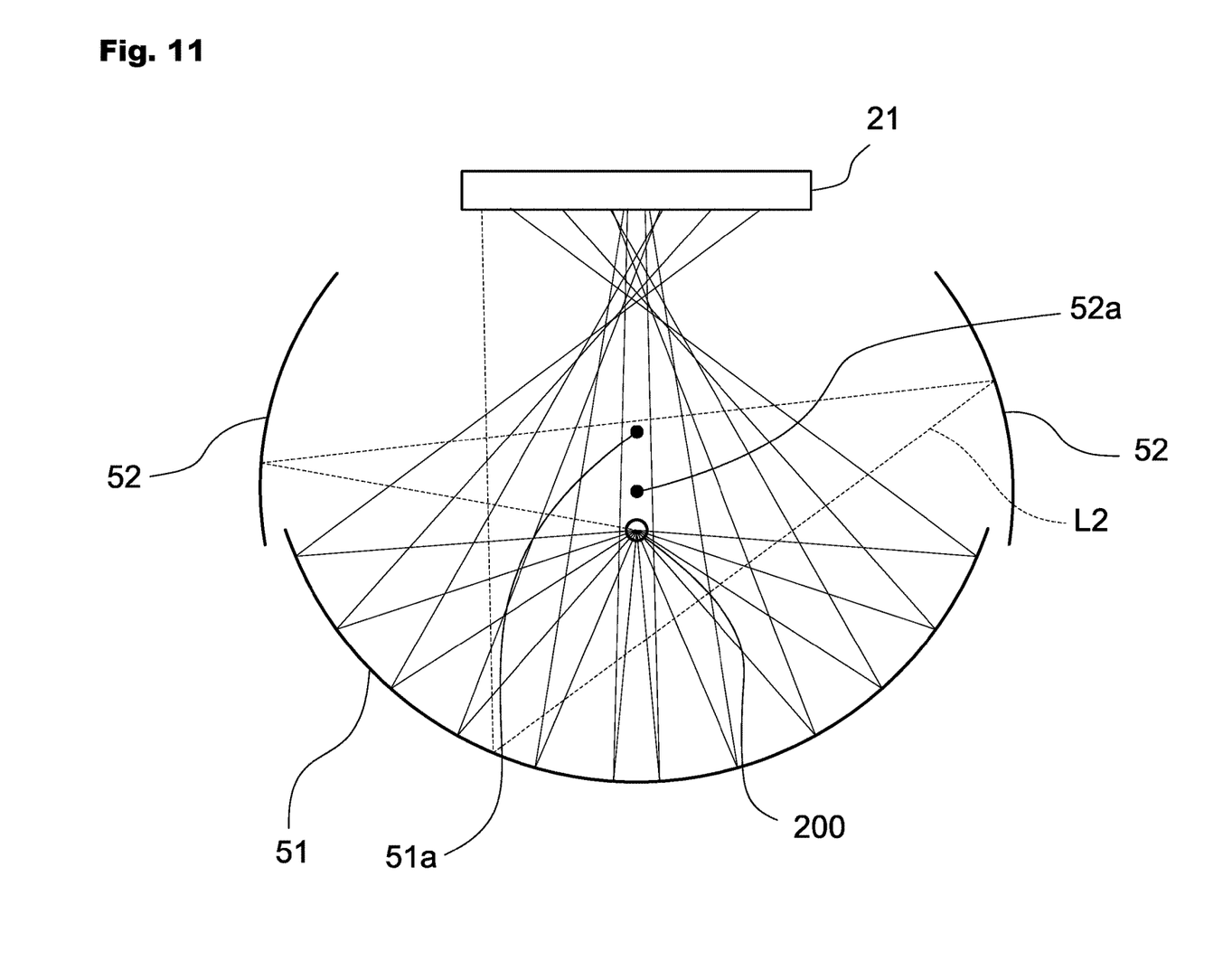
FIG. 11 is a drawing that schematically shows a reverse ray trace of the photoirradiation device of the working example having another configuration.

FIG. 11 is a drawing that schematically shows a reverse ray trace of the photoirradiation device 1 when the center 52a of the second reflector 52 is positioned further away from the light source 21 than the center 51a of the first reflector 51. FIG. 11 also shows only the light reflected by the reflectors (51, 52) similarly to FIG. 8.

As has been described above with reference to FIG. 8, when the center 300a of the reflector 300 is close to the center position of the optical fiber 200 as in Reference Example 1, the light emitted from the light source 21 and incident in regions B1 on the lateral sides of the reflector 300 is not effectively utilized. However, when two reflectors (51, 52) with different amounts of displacement are provided as shown in FIG. 11, there are created paths for the light to propagate toward the optical fiber 200 after being reflected by both of the first reflector 51 and the second reflector 52 (see light rays L2). Namely, when the second reflector 52 with a smaller amount of displacement than the first reflector 51 is provided, some light rays that could not be directed to the optical fiber 200 after being reflected by the first reflector 51 if it were not for the second reflector 52 can be directed toward the optical fiber 200 by the second reflector 52. This is assumed to be the reason why the amount of light projected to the optical fiber 200 was increased as compared to the photoirradiation devices of the reference examples also in the region where the amount of displacement of the center 52a of the second reflector 52 was positive, as shown in FIG. 10.

From the viewpoint of enhancing the effect described above, both of the first distance d1 between the center 51a of the reflective surface 51b of the first reflector 51 and the center 61a of the insertion path 61, and the second distance d2 between the center 52a of the reflective surface 52b of the second reflector 52 and the center 61a of the insertion path 61 should preferably be equal to or more than the radius of the optical fiber 200, and should more preferably be equal to or more than the diameter of the optical fiber 200. The center 51a of the reflective surface 51b of the first reflector 51 and the center 52a of the reflective surface 52b of the second reflector 52 may both be positioned closer to the outside than the optical fiber 200.

[Other embodiments]

Other embodiments will be described below.

<1> The photoirradiation device 1 described above has two reflectors (51, 52) with circular arc reflective surfaces centered on different points. Instead, the photoirradiation device 1 may include three or more reflectors with circular arc reflective surfaces centered on different points. In this case, too, the amount of light projected to the optical fiber 200 is increased as compared to the photoirradiation devices of the reference examples.

<2> The reflective surfaces of the first reflector 51 and the second reflector 52 both have a circular arc shape. A "circular arc" herein refers to a curve, as viewed from the transfer direction D1 of the optical fiber 200, with a ratio of 1 or more and not greater than 1.15 between a shortest one and a longest one of multiple lines connecting points on the outer circumference with the center position (lines corresponding to radius if the arc is a part of an exact circle), i.e., including curves that can substantially be regarded as a circular arc in a geometrical sense. The reflective surfaces of the first reflector 51 and second reflector 52 may both be formed as a curved surface, or, at least one of the reflective surfaces may be formed substantially as a curved surface by a combination of multiple flat surfaces.

<3> The radius of the reflective surface 51b in a circular arc shape of the first reflector 51 and the radius of the reflective surface 52b in a circular arc shape of the second reflector 52 may be identical, or may be different. The second reflector 52 may be formed to be continuous with the open edges 51c of the first reflector 51.

FIG. 5 shows a connecting part of the first reflector 51 and the second reflector 52 formed such that ends of the second reflector 52 are positioned inside the open edges 51c of the first reflector 51. Instead, the connecting part may be formed such that the ends of the second reflector 52 are positioned outside the open edges 51c of the first reflector 51.

<4> While the light source 21 is configured by a plurality of LED devices, the light source may instead be configured by a plurality of LD (laser diode) devices.

The photoirradiation device 1 may include multiple light sources 21. In this case, the light sources 21 may be disposed on the opposite side from the insertion path 61. i.e., the optical fiber 200, relative to the opening 53 of the second reflector 52 (see FIG. 5). In this case, the light sources 21 are disposed on the opposite side from the insertion path 61, i.e., the optical fiber 200, relative to the first reflector 51.

<5> While the insertion path 61 is circular as viewed from direction D1 in the embodiment described above, the insertion path 61 can have any shape. The insertion path 61 may be polygonal, or elliptic, for example, when viewed from direction D1.

While the insertion path 61 in the embodiment described above is formed by the interior of the insertion part 6 that is a tubular member, the photoirradiation device 1 may not necessarily have the insertion part 6 itself, in which case the insertion path 61 may be formed by the space inside the reflectors (51, 52). The "center of the insertion path 61" means the point where the optical fiber 200 passes through in a condition where the optical fiber 200 is passed through, and the point where the optical fiber 200 is to be passed through in a condition before the optical fiber 200 is passed through. In the latter case, the center position of the insertion path 61 may be the center position of an inscribed circle of the insertion path 61.

<6> In the embodiment described above wherein the photoirradiation device 1 includes the insertion path 61, the optical fiber 200 is passed through, with the center 200a of the optical fiber 200 being coincided with the position of the center 61a of the insertion path 61. Instead, the optical fiber 200 may be passed through in a condition where the center 200a is shifted from the center 61a of the insertion path 61. As described above, if the optical fiber 200 is passed through at a point shifted from the center 51a of the first reflector 51 and the center 52a of the second reflector 52, the same effects as those described above in the embodiment will be realized. In this case, the center 61a of the insertion path 61 need not necessarily be shifted from the center 51a of the first reflector 51, or shifted from the center 52a of the second reflector 52.

<7> In the embodiment described above, the photoirradiation device 1 irradiates the optical fiber 200 with light as the optical fiber is transferred. The present invention is not limited to such mode of application. Other modes, for example, wherein the optical fiber 200 is fixed when light is projected from the light source 21, are also included in the scope of the present invention.

In the embodiment described above, the photoirradiation device 1 irradiates the optical fiber 200 with light. Wire rod, or the object to be irradiated with light, is not limited to optical fiber and the object may be fiber, for example. The photoirradiation device 1 can be used to irradiate fiber with ultraviolet light for surface modification of the fiber.

DESCRIPTION OF REFERENCE SIGNS

1 Photoirradiation device
2 Light source unit
3 Insertion unit
4 Connecting part
4a Rotation axis
5 Main body
6 Insertion part
7 Fixing part
8 Main body cooling part
8a Cooler main body
8b Inlet
8c Outlet
21 Light source
21a Central region of light source
21b End region of light source
22 Light source cooling part
22a Cooler main body
22b Inlet
22c Outlet
23 Housing
23a Light-transmitting part
23b Light-shielding part
24 Power supply unit
24a Power source connector
24b Terminal block
50 Hollow part
51 First reflector
51a Circular arc center of first reflector
51b Reflective surface of first reflector
51c Open edge
52 Second reflector
52a Circular arc center of second reflector
52b Reflective surface of second reflector
53 Opening
61 Insertion path
61a Center of insertion path
71, 72 Clamp member
100 Optical fiber production apparatus
110 Transfer device
111, 112 Transfer member
120 Coating device
200 Optical fiber
200a Center of optical fiber
300 Reflector of reference example
300a Circular arc center of reference example reflector
300b Reflective surface of reference example reflector
d1 First distance
d2 Second distance

The invention claimed is:

1. A photoirradiation device comprising:
an insertion path for inserting a wire rod;
a first reflector having a circular arc shape centered on a point shifted from a center of the insertion path by a first distance, one side of the first reflector facing the insertion path being a reflective surface;
a second reflector disposed adjacent open edges of the first reflector and having a circular arc shape centered on a point shifted from the center of the insertion path by a second distance that is different from the first distance, one side of the second reflector facing the insertion path being a reflective surface; and
a light source that is positioned on an opposite side of the insertion path from the first reflector and that projects light toward the wire rod.

2. The photoirradiation device according to claim 1, wherein the light source is configured by a plurality of LED devices.

3. The photoirradiation device according to claim 2, wherein the center of the insertion path is shifted from a circular arc center of the first reflector and a circular arc center of the second reflector in a direction away from the light source.

4. The photoirradiation device according to claim 3, further comprising an insertion part made of a material having a transmitting property to light emitted from the light source, and forming the insertion path inside, wherein
the insertion part has an outer circumference positioned closer to the circular arc center of the first reflector relative to the reflective surface of the first reflector, and positioned closer to the circular arc center of the second reflector relative to the reflective surface of the second reflector.

5. The photoirradiation device according to claim 2, further comprising an insertion part made of a material having a transmitting property to light emitted from the light source, and forming the insertion path inside, wherein
the insertion part has an outer circumference positioned closer to the circular arc center of the first reflector relative to the reflective surface of the first reflector, and positioned closer to the circular arc center of the second reflector relative to the reflective surface of the second reflector.

6. The photoirradiation device according to claim 2, wherein the reflective surface of the first reflector and the reflective surface of the second reflector are formed as a curved surface.

7. The photoirradiation device according to claim 2, wherein the reflective surface of the first reflector and the reflective surface of the second reflector are formed by a plurality of flat surfaces arranged in a circular arc shape.

8. The photoirradiation device according to claim 1, wherein the center of the insertion path is shifted from a circular arc center of the first reflector and a circular arc center of the second reflector in a direction away from the light source.

9. The photoirradiation device according to claim 8, further comprising an insertion part made of a material having a transmitting property to light emitted from the light source, and forming the insertion path inside, wherein
the insertion part has an outer circumference positioned closer to the circular arc center of the first reflector relative to the reflective surface of the first reflector, and positioned closer to the circular arc center of the second reflector relative to the reflective surface of the second reflector.

10. The photoirradiation device according to claim 8, wherein the reflective surface of the first reflector and the reflective surface of the second reflector are formed as a curved surface.

11. The photoirradiation device according to claim 8, wherein the reflective surface of the first reflector and the reflective surface of the second reflector are formed by a plurality of flat surfaces arranged in a circular arc shape.

12. The photoirradiation device according to claim 1, further comprising an insertion part made of a material having a transmitting property to light emitted from the light source, and forming the insertion path inside, wherein
the insertion part has an outer circumference positioned closer to the circular arc center of the first reflector relative to the reflective surface of the first reflector, and positioned closer to the circular arc center of the second reflector relative to the reflective surface of the second reflector.

13. The photoirradiation device according to claim 12, wherein the reflective surface of the first reflector and the reflective surface of the second reflector are formed as a curved surface.

14. The photoirradiation device according to claim 12, wherein the reflective surface of the first reflector and the reflective surface of the second reflector are formed by a plurality of flat surfaces arranged in a circular arc shape.

15. The photoirradiation device according to claim 1, wherein the reflective surface of the first reflector and the reflective surface of the second reflector are formed as a curved surface.

16. The photoirradiation device according to claim 1, wherein the reflective surface of the first reflector and the reflective surface of the second reflector are formed by a plurality of flat surfaces arranged in a circular arc shape.

17. A photoirradiation method with which the photoirradiation device of claim 1 projects light toward the wire rod, the photoirradiation method comprising:
a step of inserting the wire rod into a region inside the reflective surface of the first reflector and inside the reflective surface of the second reflector such that a center position of the wire rod is shifted by a first distance from a center of the reflective surface of the first reflector and shifted by a second distance that is different from the first distance from a center of the reflective surface of the second reflector; and
a step of projecting light toward the wire rod from the light source positioned on an opposite side of the wire rod from the first reflector.

* * * * *